United States Patent [19]

Williams

[11] 4,010,710
[45] Mar. 8, 1977

[54] APPARATUS FOR COATING SUBSTRATES

[75] Inventor: Ernest E. Williams, Fullerton, Calif.

[73] Assignee: Rockwell International Corporation, El Segundo, Calif.

[22] Filed: Sept. 20, 1974

[21] Appl. No.: 508,007

[52] U.S. Cl. .................................. 118/49; 118/503
[51] Int. Cl.² ......................................... C23C 13/12
[58] Field of Search ........................... 118/48–49.5, 118/52–56, 500, 503

[56] References Cited

UNITED STATES PATENTS

| 3,486,237 | 12/1969 | Sawicki .......................... 118/49 X |
| 3,598,083 | 10/1971 | Dort et al. ............................ 118/48 |
| 3,853,091 | 12/1974 | Christensen et al. ................. 118/49 |
| 3,858,547 | 1/1975 | Bergfelt ............................... 118/49 |

OTHER PUBLICATIONS

IBM Technical Disclosure Bulletin, "Planetary Evaporation System Having Multiple Rotations," Lee, vol. 16, No. 9, [Feb. 1974], pp. 2865-2868.

Primary Examiner—Mervin Stein
Attorney, Agent, or Firm—H. Fredrick Hamann; G. Donald Weber, Jr.; Roland G. Rubalcava

[57] ABSTRACT

A metal coating is deposited upon the surface of a number of electronic circuit device wafers in an evacuated chamber by means of tooling that rotates the wafers about three different axes. A primary three-armed spider rotates about a primary axis and carries on each of its arms a four-armed secondary spider holding a wafer on each of its arms. Four of such primary spiders together with the secondary spiders mounted thereon are carried respectively by four upright standards that rotate in unison about a vertical axis of a cloud of metal vapor filling the chamber. Rotation of the standards causes rotation of the primary spiders relative to the standards and also rotation of each secondary spider relative to its primary spider. The arrangement causes each wafer to sweep up and down along outer portions of the metal vapor cloud as it rotates about the vertical axis of the cloud and also causes each wafer to rotate about its own axis several times for each up and down sweep. An optimum acute angle between the surface of each wafer and a line from the wafer to the source of metal vapor cloud remains within a narrow range during all motion and at all positions of each wafer.

20 Claims, 17 Drawing Figures

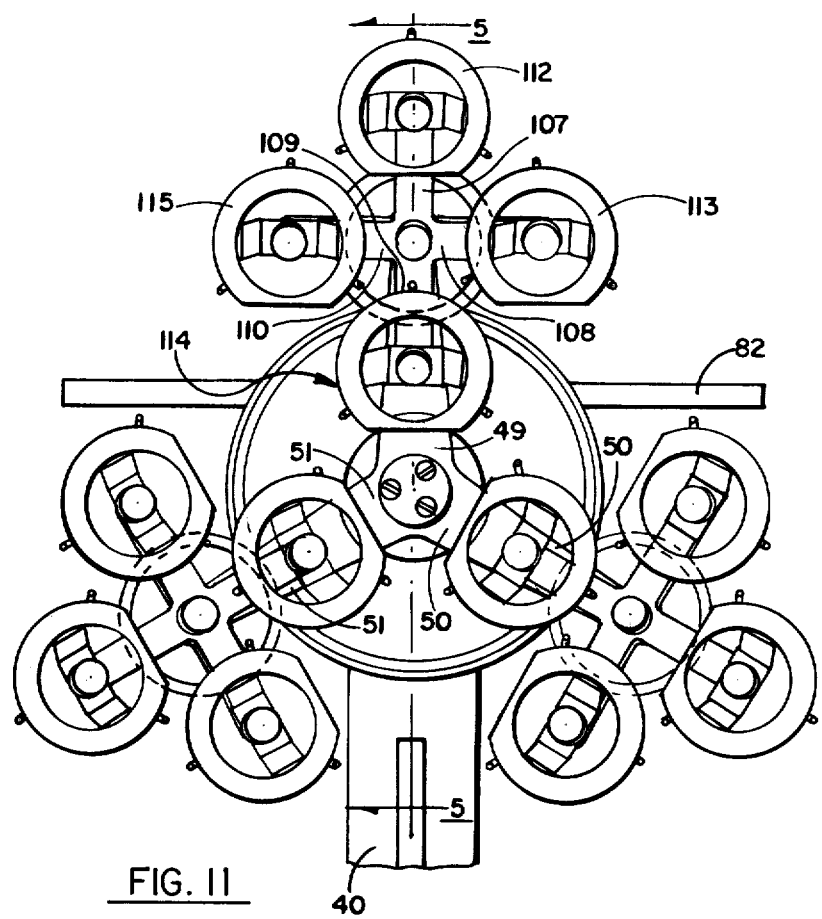
FIG. 11
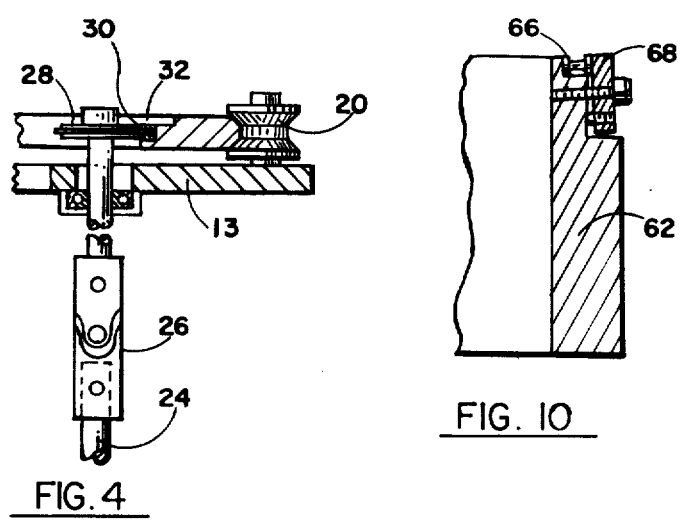
FIG. 4
FIG. 10
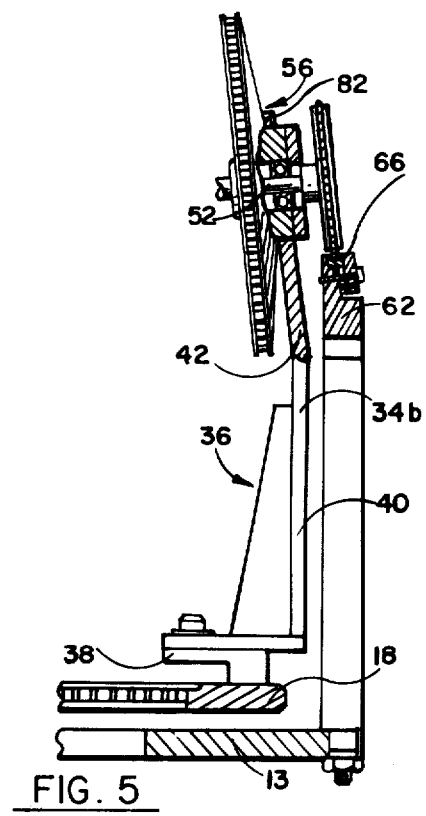
FIG. 5

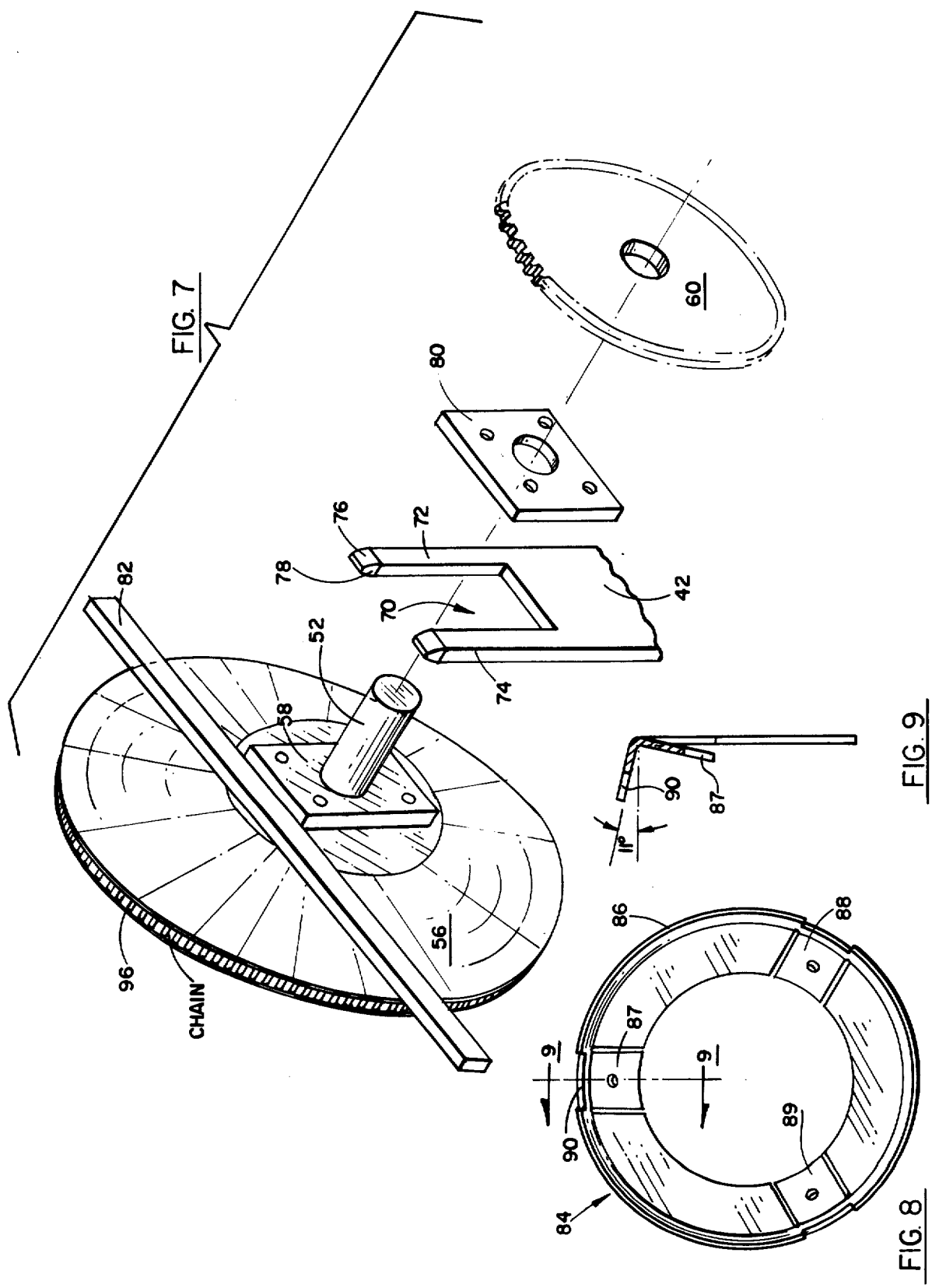

APPARATUS FOR COATING SUBSTRATES

BACKGROUND OF THE INVENTION

The present invention relates to vapor coating and more particularly concerns apparatus for depositing thin coatings on a number of substrates. The invention is particularly useful for substrates having irregular surfaces.

Thin, uniform coating of various types of substrates is carried out for a number of purposes and in many different fields. Perhaps the most rapidly growing field in which such coating is performed is that relating to electronic equipment. The broad variety and great quantity of electronic devices being manufactured, sold and used throughout the world is largely a result of decreasing costs per electronic function which in turn is made possible by the extensive use of integrated circuits. Although small size and weight, together with increased reliability, have contributed to the demand and application of integrated circuits, it is the recent startling reduction in cost of fabrication that is primarily responsible for the rapid growth of this field.

Low cost is based primarily upon improvements in batch fabrications. Integrated circuits are made by simultaneously processing many wafers or substrates of materials such as silicon and silicon oxide. Each such wafer may bear hundreds of integrated circuits and thousands of transistors. Each is processed through a number of consecutive chemical and metallurgical operations. Critical dimensions are commonly measured in micrometers and sometimes in angstroms or tenths of a micrometer. Tolerances are small, commensurate with the critical dimensions themselves, and failure to meet such tolerances results in a defective device or a device of considerably shortened life.

A commonly employed type of integrated electronic circuit device is known as the metal-oxide-semiconductor device, also known as the MOS device. Details and some fabrication techniques of MOS devices are described in an article "Metal-Oxide-Semiconductor Technology" by William C. Hittinger in "Scientific American", August, 1973, pages 48 through 57. In MOS circuit fabrication, various types of silicon oxide, both doped and undoped, may be deposited upon a silicon base. Certain irregularities, often in the form of channels, are then formed on the surface of this multilayer substrate. The irregular or channeled surface is then uniformly covered with a thin coating of metal that is subsequently etched away in a predetermined pattern. The metal remaining provides electrical conductors along the surfaces of the substrate. Other steps, not pertinent to the present invention are employed, but not described herein.

The metal must be deposited in a coating of uniform thickness and density over the irregular surface, including bottom and both sides of the channels or other irregularities or depressions formed in the substrate. Because of the relatively sharp angulations of the surface formed by the various channels, difficulties have been experienced in providing coatings of a uniform thickness and density. The edges or brink of such channels are especially critical areas for such metal coating. Where metal coating has less than specified thickness, exceedingly high current densities may occur, current densities high enough in some cases to destroy the electrically conductive metallic lead and thereby destroy operation of the circuit.

In attempting to solve these problems of high quantity batch fabrication with uniform high quality and low rejection rate, many different tooling configurations have been attempted. Examples of these configurations are shown in U.S. Pat. Nos. 2,847,325 to Riseman et al, 3,128,205 to Illsey, 3,322,655 to Garibotti and 3,594,227 to Oswald. These patents describe structures that provide various motions of groups of substrates through and about the material to be deposited upon the wafer surface. These prior art devices may coat large numbers of wafers or substrates but all suffer from production of large numbers of defective coatings, particularly where the coating is to be applied to the irregular or channeled substrate surfaces.

For proper and reliably uniform coating of surface irregularities that may be measured in thousandths or even ten thousandths of an inch, it is required that the surface to be coated is presented at a selected acute angle to a line extending from the surface to the source of coating material. Prior art devices fail to maintain such angle in efficient and successfully productive tooling.

The prior art methods and devices involve apparatus of such great complexity that breakdown is frequent, inoperable time is great, and efficiency is low. Further, uniformity of coating thickness, particularly over edges of channels and grooves, is poor, and percentages of unacceptable wafers are undesirably large.

To provide uniformity of coating thickness, applicant's assignee has previously employed wafer metal deposition tooling embodying a number of superposed vertically stacked rings, each supporting a circular row of wafers, inclined with respect to a source of metal vapor, and all driven about a common vertical axis. As the rings are driven about the common vertical axis, each wafer is caused to rotate about its own axis and, thus, both sides of variously oriented channels on its surface are properly coated. In this prior system of applicant's assignee, there is no vertical sweeping of the wafers through the cloud of metal vapor within the evacuated chamber by any one wafer since each travels basically in a single circular horizontal path. Thus, the wafers individually and collectively fail to sweep through sufficiently large areas of the metal vapor cloud. Further, because of the large number of separately mounted moving parts and the requirement that many of these be demountable or at least accessible for ready detachment and attachment of the wafers themselves, this mechanism is subject to frequent breakdowns, requiring inordinately long times for repair.

Accordingly it is an object of the present invention to provide uniform coating of substrates both reliably and efficiently, while avoiding or minimizing the above mentioned disadvantages.

SUMMARY OF THE INVENTION:

In carrying out the principles of the present invention in accordance with a preferred embodiment thereof, a plurality of wafers are moved through upper and lower portions of a vapor cloud of material and each wafer is angularly positioned during the motion to maintain the angle between its surface and a line from the wafer surface to a fixed point near the bottom of the cloud within a predetermined range. More specifically, according to certain aspects of the invention, the wafers are mounted in clusters of groups of wafers, the clusters of groups are rotated about a primary axis and, during such rotation, the groups are also respectively rotated about respective secondary axes which extend at an acute angle relative to the primary axis. The clusters of groups are also caused to rotate about a substantially vertical axis of the vapor cloud of material to be coated upon the wafers. Accordingly, three separate rotations cause all of the wafers to move about the vertical axis of the vapor cloud, cause all of the wafers to sweep up and down through the cloud as they move about the cloud, cause the up and down motion to follow a convolutional path, and enable the wafers to contact significantly greater areas of the cloud. The configuration is selected so that during all of these motions, all wafer surfaces maintain a preselected orientation with respect to a line between the wafer and the cloud source, within a relatively limited range.

BRIEF DESCRIPTION OF THE DRAWINGS:

FIG. 4 shows details of the base ring drive;

FIG. 5 shows a cluster standard and a primary disc mounted thereto;

FIG. 7 is an exploded perspective view of certain aspects of the detachable mounting of the cluster assembly upon the cluster standard;

FIGS. 8 and 9 show details of part of the primary support spider;

FIG. 10 is a fragmentary sectional detail of the primary drive train;

FIG. 11 is a front view of a full cluster of three groups of wafer holders;

DETAILED DESCRIPTION

Figure 1:
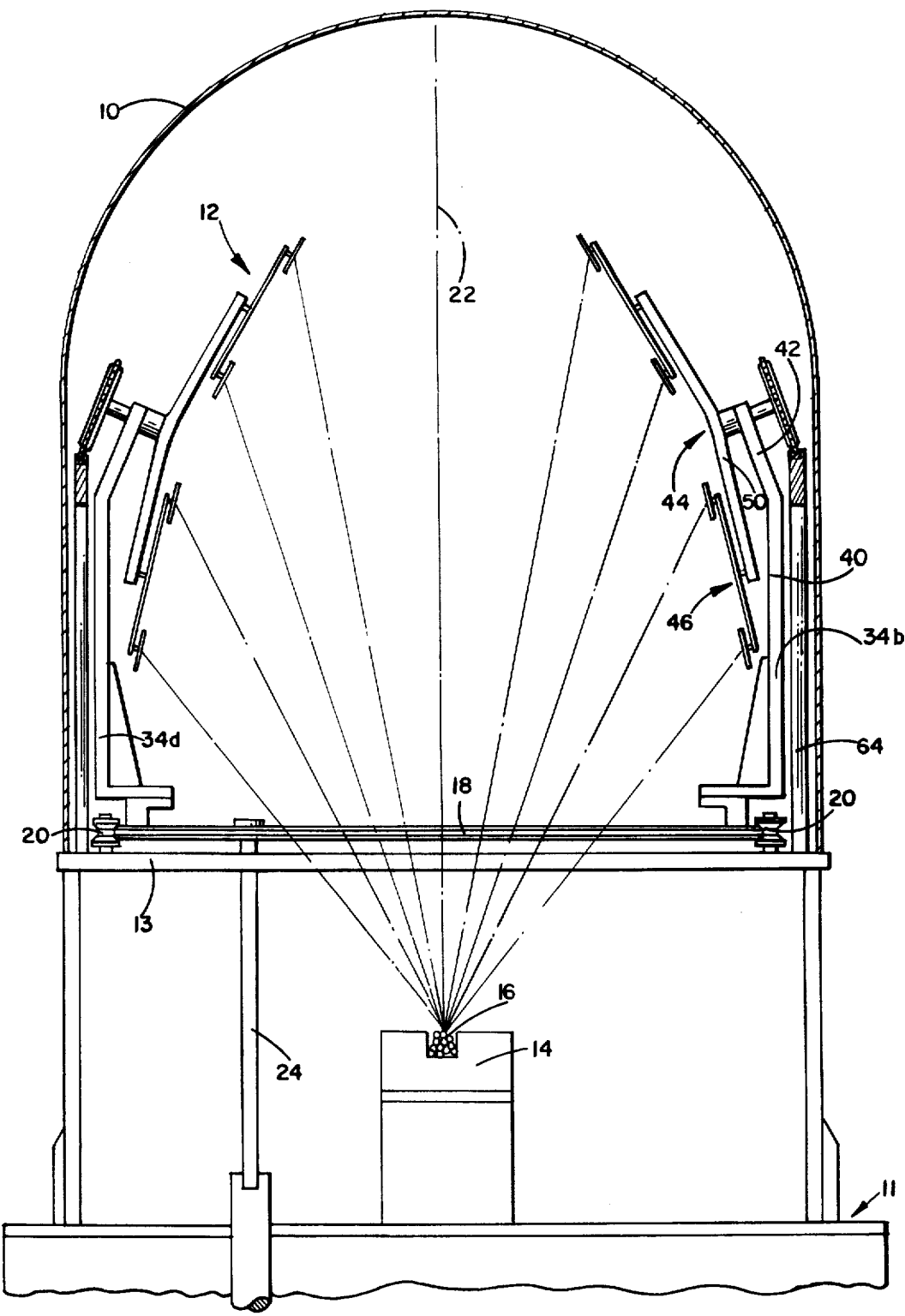
FIG. 1 illustrates the overall arrangement and configuration of parts of a preferred embodiment of wafer metal deposition tooling embodying principles of the present invention.

Illustrated in FIG. 1 are portions of a substantially conventional vacuum chamber in which is mounted a wafer transport assembly embodying principles of the present invention. The conventional chamber is in the form of a bell jar having a removable cover 10 that may be detachably secured and sealed to a lower structure 11. Mounted within the chamber defined by the cover 10 and structure 11 is a hearth 14 carrying a body or a source 16 of metal, such as aluminum, that is to be vaporized by any one of a number of well-known methods and apparatus (not shown) to form a cloud of minute aluminum particles, i.e. an aluminum vapor cloud, that moves upwardly toward the top of the chamber, substantially filling the chamber above the hearth. Suitable mechanism (not shown) is included for evacuating the sealed interior of the chamber to eliminate impurities and facilitate vapor deposition, as is well-known in the art.

Mounted within the vacuum chamber 10 is a wafer transport assembly 12 embodying principles of the present invention. The assembly includes an annular base ring 18 that is rotatably mounted to the lower structure 11 by means of a plurality of circumferentially spaced grooved rollers 20 (FIG. 4), each of which is journalled about a vertical axis upon roller support ring 13 of the lower structure 11.

Base ring 18 is driven about a vertical axis 22 that coincides with the vertical axis of the vacuum chamber, by means of a drive shaft 24 extending into the chamber through a sealed opening (not shown) for connection to a driving motor of selectively variable speed (not shown). Fixed to drive shaft 24 via a universal connection 26 (FIG. 4) is a base drive gear or sprocket wheel 28 that meshes with a chain 30 held in a radially inwardly facing peripheral groove of the annular base ring by means of an annular chain holding plate 32. Use of a fixed chain 30, instead of a gear formed on the base drive ring as is commonly employed in similar mechanisms, provides a significant improvement in initial cost and repair time. The chain is readily available as a standard commercial component, easily secured to the base ring 18, and quickly and simply replaced if necessary.

Figure 2:
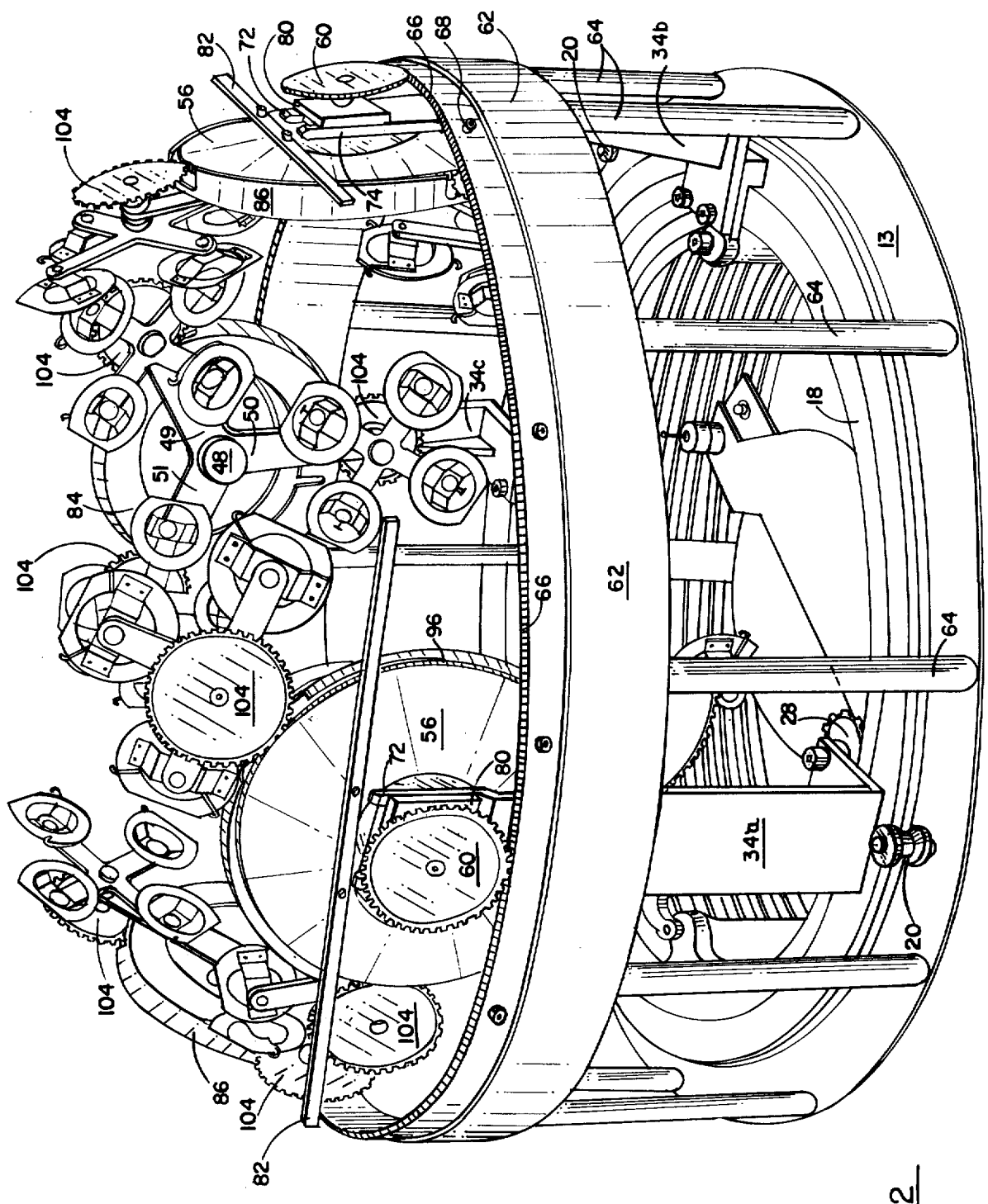
FIG. 2 is a perspective view of a wafer transport assembly of the present invention.
Figure 3:
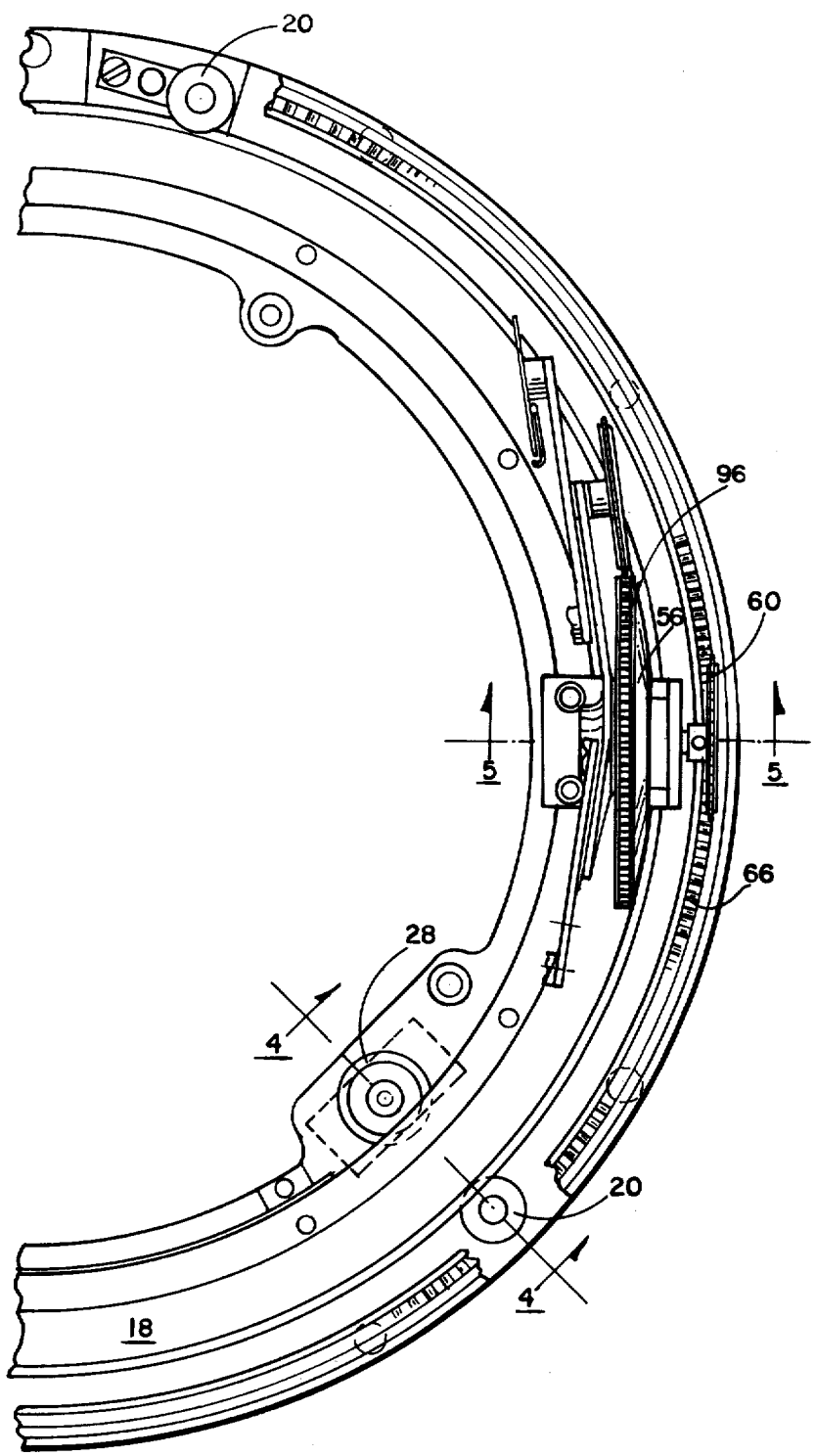
FIG. 3 illustrates part of the annular base ring and its support apparatus.
Figure 6:
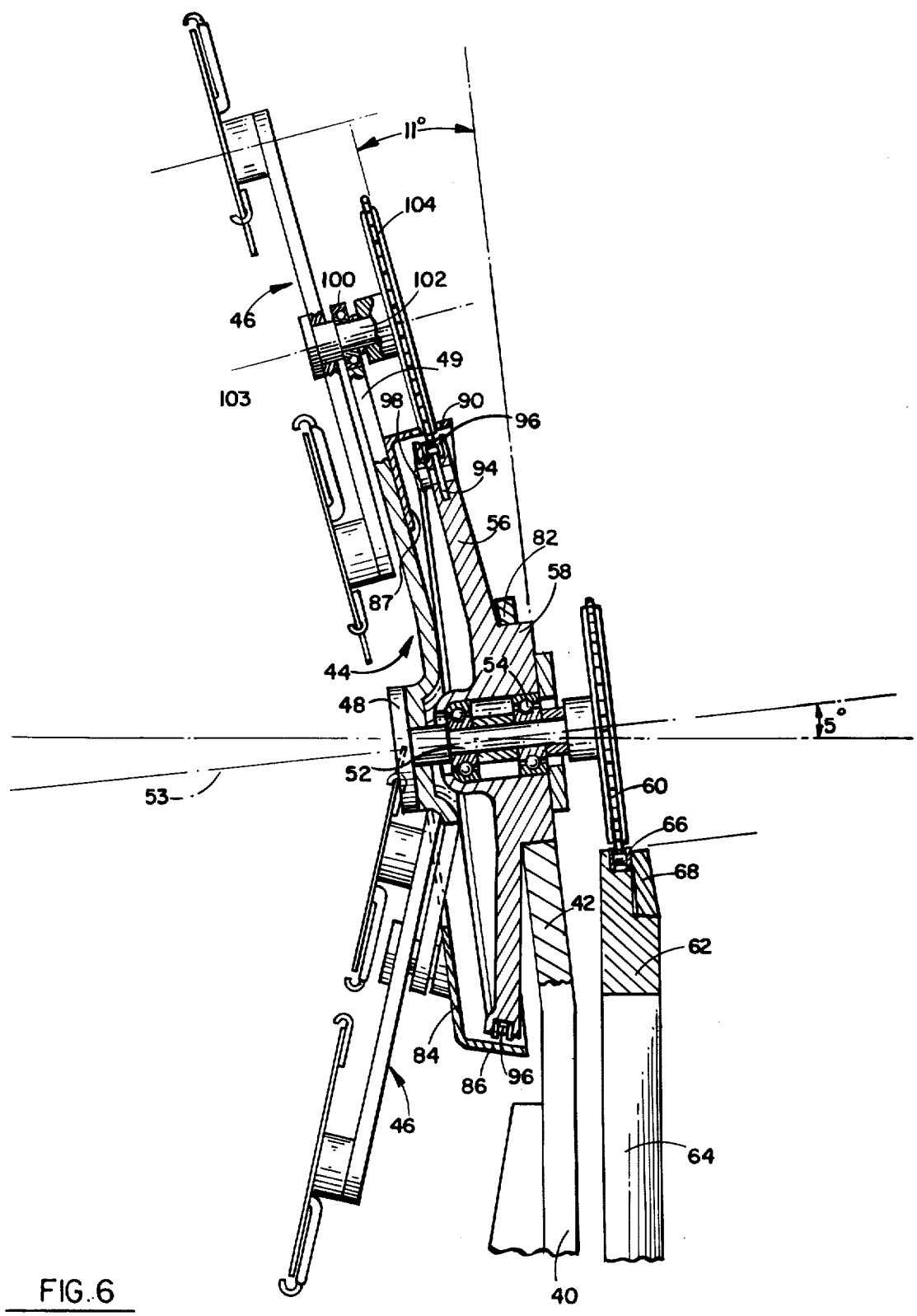
FIG. 6 is an enlarged sectional view of a cluster assembly.
Figure 12:
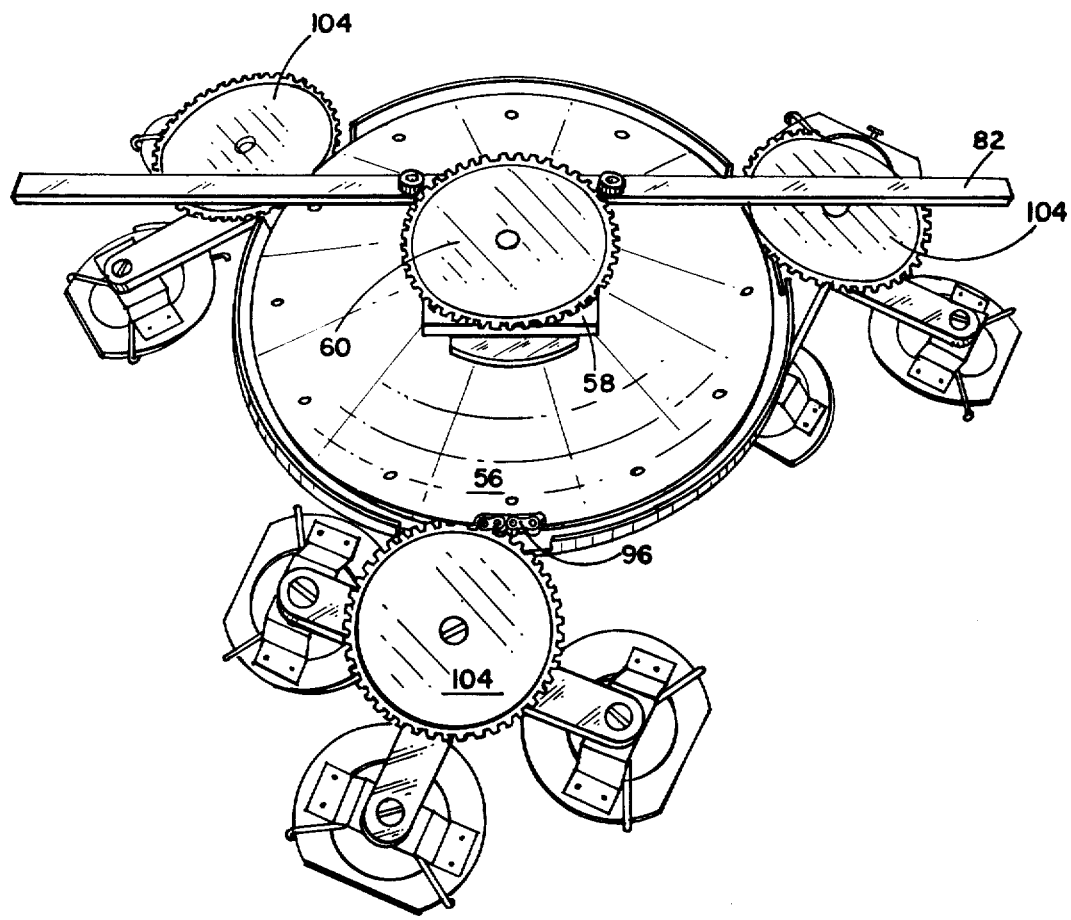
FIG. 12 is a rear view of the cluster of FIG. 11.

As illustrated in FIGS. 1, 2, and 5, a plurality of cluster standards 34a, 34b, 34c and 34d, are fixed to the drive ring 18 and mutually spaced around the periphery thereof. Each standard is formed of a reinforced L-shaped bracket 36 that is bolted or otherwise detachably secured to an angle bracket 38 fixed to the annular base ring 18. Each standard has an upstanding leg of which a lower portion 40 (FIGS. 5 and 6) extends at right angles to the plane of the base ring 18. An upper portion 42 of each such leg is angled inwardly (by an angle on the order of 5°, for example) with respect to the vertical extent of lower leg portion 40. The upper portion 42 of each standard carries a cluster of groups of wafer holders. As illustrated in FIGS. 5 and 6, each cluster includes a primary spider or primary support structure 44 and a plurality of secondary spiders or secondary support structures 46. Each of the latter carries a group of wafer holders as will be more particularly described below. Since all cluster standards and cluster assemblies are identical, only one is described.

Each primary spider 44 includes a central hub 48 and three radially outwardly extending equally spaced arms 49, 50, 51 (shown in FIG. 11). Fixed to the hub 48 is an axle or shaft 52 that is rotatably carried in bearings 55 that are mounted within a driving disc 56. Arms 49, 50 and 51 of the spider 44 are inwardly angulated with respect to a normal to the axis 53 of the shaft 52 through a relatively small angle (such as 11°, for example) for purposes to be more particularly described hereinafter. In other words, each arm lies in a plane that extends inwardly at a small angle relative to a plane perpendicular to the axis of shaft 52.

Driving disc 56 is of dish shape so that its outer portions are also inwardly angulated with respect to a plane normal to axis 53 of shaft 52. Accordingly these outer portions of the driving disc 56 extend in planes parallel to the planes of the primary spider arms 49, 50, 51.

Fixed to an outer end of shaft 52 is a primary drive gear or sprocket wheel 60 that meshes with a chain 66. The lower structure of the evacuated chamber includes a fixed primary drive ring 62 that is securely carried by a plurality of circumferentially spaced upstanding posts 64. Primary drive ring 62 is formed with a stepped peripheral recess, best seen in FIG. 10, in which the upwardly facing annular drive chain 66 is fixedly clamped by an annular chain clamp ring 68 bolted or otherwise suitably secured to the primary drive ring 62.

Gear or sprocket wheel 60, affixed to the axle 52 of the primary spider, meshes with the primary drive chain 66 and is thereby rotated as the cluster standard, such as standard 34b, moves with annular base ring 18 about the vertical axis of the chamber.

The entire cluster assembly is quickly and securely mounted upon the standard in operable relation to chain 66 and readily detached therefrom. Accordingly, while wafers of one set of four clusters are being coated within the evacuated chamber, a second set of four clusters may be loaded with wafers not yet coated. Upon completion of the coating of the wafers of the first set, the latter may be simply and quickly detached from the cluster standards and a second set may be positioned in operable relation. Thus there is a minimum of time in which the vacuum chamber is not in operation. To this end, each standard (as best shown in FIG. 7) has its upper end bifurcated, providing a notch 70 defined by parallel and mutaully spaced upstanding standard branches 72, 74 which are each bevelled on two surfaces thereof as indicated at 76, 78. Drive disc 56 has a fixed hub 58 of generally elongated rectangular shape, having a relatively narrow width that is substantially equal to the width of the recess 70. The hub 58 therefore is a smooth and snug sliding fit within the recess 70. Fixed to the hub 58, to provide therewith a substantially T-sectioned disc connector, is a rectangular plate 80 that is wider than the width of recess 70 and wider than the width of hub 58. Plate 80 has a width substantially equal to the width of the upper portion 42 of the standard and is fixed to the hub 58 by means of a plurality of screws or bolts (not shown). A rigid bar 82 is fixed to the back surface of the disc 56, extending substantially horizontally, to facilitate handling of the cluster and enable the cluster connector to be inserted into the standard recess and removed therefrom as a unit. The parts are configured so that when a cluster is assembled upon the bifurcated upper end of the standard, primary drive gear 60 is in firm engagement with chain 66 (FIGS. 2, 5, and 6) but the standard provides all or nearly all of the vertically directed component of supporting forces of the entire cluster. The snug sliding engagement of branches 72, 74 of the standard, between the plate 80 and the rear surface of drive disc 56 cooperates with the engaging gear 60 and chain 66 to complete the firm but detachable support of the cluster upon the standard.

As illustrated in FIGS. 8 and 9, a primary spider shield 84 in the form of an annular plate having a peripheral flange 86 is provided with a plurality of periperally spaced inwardly angulated sections 87, 88, 89, that are bolted to the rear side of the respective arms 49, 50 and 51 of a primary spider. Flange 86 is cut away at sections 87, 88 and 89, as indicated at 90 for flange section 87.

The radially outer edge of primary drive disc 56 is formed with a peripheral groove 92 communicating with an annular slot 94. A secondary drive chain 96, substantially identical to each of the primary drive chain 66 and base drive chain 30, is mounted within the groove 92 and held therein by clamping action of a bolt 98 that extends through an aperture at one side of slot 94 and is threaded in an aperture at the other side of the slot.

Referring to FIG. 6, each of the three arms of each primary spider 44 carriers a secondary spider 46. All secondary spiders are mutually identical both in configuration and relation to the corresponding arm of the primary spider upon which they are mounted. Accordingly, description of only one of the secondary spiders will suffice to describe all. Arm 49 of the primary spider has an aperture extending along an axis perpendicular to the plane of the arm, at the outer end of the arm, which is provided with bearings 100. In these bearings is rotatably mounted an axle 102 fixedly carrying on an outer end thereof a secondary drive gear or sprocket wheel 104. Gear or sprocket wheel 104 extends through the cut away portion 90 (see also FIG. 8) in flange 86 of the primary disc shield 84 and into engagement with the secondary drive chain 96 that it is fixed to the drive disc 56. There are three such cut away flange portions, one on each of the shield sections 87, 88, and 89, respectively, and there is a secondary drive gear or sprocket wheel 104 for each of the other two secondary spiders carried by the other two arms of the primary spider. Accordingly, all three of the secondary spiders are driven about their respective axes 103 of axles 102, rotating relative to the arm of the primary spider upon which they are individually supported. These rotations are in response to rotation of the primary drive disc 56 about the axis 53 of its shaft 52. Because of the angulation of the several arms of the primary spider 44 with respect to a plane perpendicular to its axis of rotation 53, axis 103 of each secondary spider is also angulated with respect to a plane normal to the primary axis of rotation 53. Accordingly, each secondary axis 103 is angulated by a like amount with respect to the primary axis 53. This relative angulation of the secondary and primary axes helps to provide the desired orientation of the substrate throughout the various motions thereof as will be more particularly described hereinafter.

Figure 13:
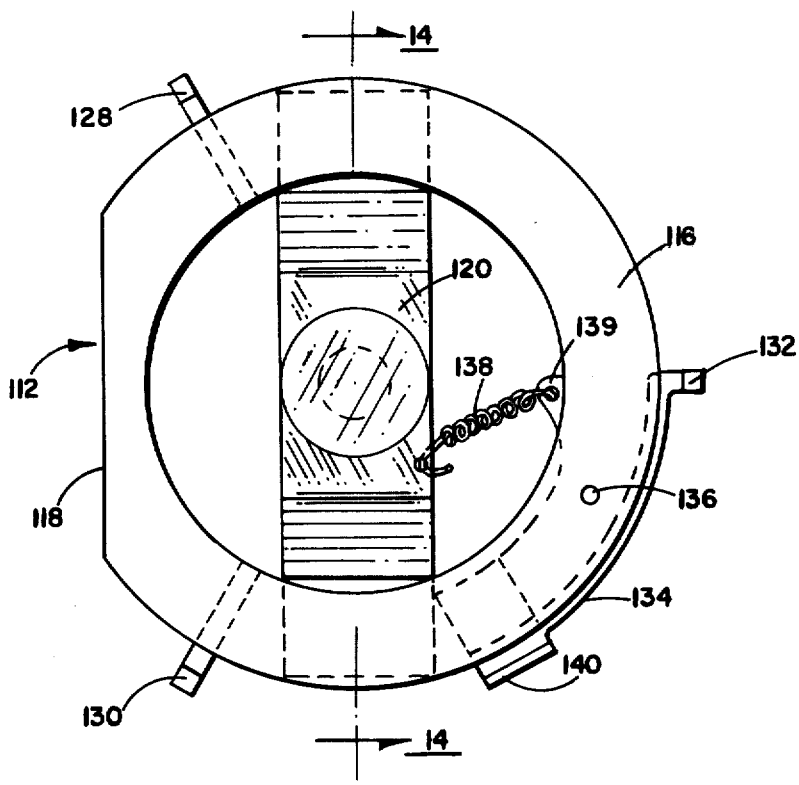
FIGS. 13 and 14 illustrate details of an individual wafer holder.
Figure 14:
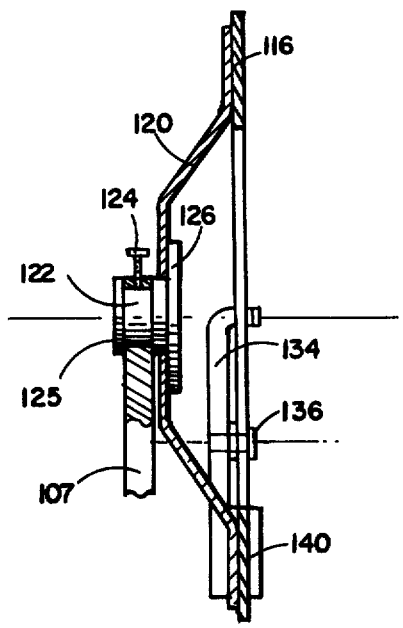

Referring to FIG. 11, the secondary spider has four symmetrically disposed arms 107, 108, 109 and 110 extending radially from axle 102 (FIG. 6). Fixedly carried at an end of each of these arms is a respective one of a group of four substrate or wafer holders 112, 113, 114 and 115. Each wafer holder, as illustrated in detail in FIGS. 13 and 14, comprises an annular plate 116 that is truncated as at 118 to allow a circular substrate to extend beyond the plate 116 for ease of handling during insertion and removal of the substrate upon and from the holder. The plate is mounted to the associated arm, such as arm 107 (FIG. 14), by means of a structural bridging strip 120 which is fixed to the back surface of plate 116 and also fixed to the secondary spider arm 107 by means of a pin 122 extending through an aperture in the arm 107 and having enlarged heads 125, 126. Pin 122 is fixed to strip 120 and adjustably oriented about the pin axis by means of a locking set screw 124. Fixed to the under surface of the annular plate 116 and extending upwardly at a small distance radially outwardly of the periphery of the plate are a pair of substrate clips 128, 130 which cooperate with a movable clip 132 to detachably secure a substrate, such as a circular wafer to be coated (not shown), to and upon the wafer holder 112. The three clips 128, 130 and 132, are equally spaced about the periphery of the annular plate 116.

The movable clip 132 is fixed to a lever 134 pivoted to the back side of plate 116 upon a pin 136 and resiliently urged in a direction of counter-clockwise rotation (as viewed in FIG. 13) about the pin by a spring 138 connected between the structural bridge 120 and an inwardly facing ear 139 of lever 134. At the end of lever 134 remote from the end that carries clip 132 is an upstanding flange 140 that serves as a handle or operator for the lever. Accordingly, pressing the flange 140 radially inwardly will cause the clip 132 to move radially outwardly and thus allow a wafer to be placed upon or removed from the wafer holder. Release of the inward pressure upon the flange 40 allows the spring 138 to move the clip 132 radially inwardly to grasp and firmly clamp the inserted wafer against all three of the wafer clips 128, 130 and 132. The entire wafer holder is adjustable by rotation about the axis of pin 122 merely by loosening the set screw 124.

MOTIONS OF THE WAFER TRANSPORT ASSEMBLY

As previously described and readily seen with respect to FIGS. 1 and 2, the entire wafer transport assembly moves upon a first path which is defined by rotation of the entire assembly about the vertical chamber or base axis 22. This first rotation is accomplished by the selectively variable speed drive shaft 24 together with sprocket wheel 28 which is enmeshed with base drive chain 30. This driven rotation of base ring 18 about the base axis 22 causes translation along a circular path of the standards 34a, 34b, 34c and 34d, and accordingly, of each of the cluster assemblies carried thereby. This motion of the cluster assemblies relative to drive ring 62 causes rotation of the primary drive sprocket wheel 60 of each cluster assembly. Thus, these sprocket wheels move relative to the primary drive chain 66 and are thereby rotated to accomplish rotation of the respective clusters about the respective primary axes 53. Rotation about axis 53 causes each drive disc 56 together with its secondary drive chain 96 to move past the periphery of the several enmeshing drive wheels 104, thereby to cause rotation of these wheels which, in turn, rotate the respective secondary four arm spiders about the respective secondary axes 103 (FIG. 6).

Thus, there is a simultaneous motion of any one group of wafer holders (a single group comprising the four holders of any one secondary four-armed spider) about each of three different axes, axis 22, axis 53 and axis 103. Each group of each cluster has its own individual secondary axis 103. Each cluster (a cluster comprising the three groups of holders on any one primary three-armed spider) has its own primary axis 53 and all clusters and groups rotate about the common base axis 22.

The arrangement is such as to cause any individual wafer, in effect, to sweep up and down substantially between top and bottom of the vapor cloud within the chamber, as it sweeps circumferentially, rotating about the vertical axis of the cloud. During the course of this combined up and down and circumferential rotation, each wafer is caused to sweep through a curved or convolutional path to thereby cause each wafer to sweep through significantly larger areas in and about the outer portions of the vapor cloud.

Since the density of the cloud may vary from place to place within the cloud and during the coating process, the greater the area through which any single wafer is caused to sweep, the more likely it is that density and thickness of the resulting coating will be close to an average value of coating, thus affording a better averaging of cloud density. Since all of the wafers sweep through substantially similar paths, or in any event, through paths of equal length and over equally large areas of the cloud, all of the wafers are provided with a coating that is close to such average in both thickness and density. Accordingly, there is considerably less variation in coating thickness and density from wafer to wafer and from batch to batch, to provide a significant improvement in the highly desirable uniformity of thickness and coating of the wafers.

Not only does each wafer move circumferentially about the vertical axis of the cloud and up and down as it does so, but, in effect, in the course of this convolutional motion, each wafer rotates about its own axis. In one vertical sweep, that is from top to bottom and back to the top again, for example, each wafer may rotate two full 360° revolutions about its own axis. This rotation about the wafer axis enables all sides of any surface irregularity or channel, no matter how such channel is oriented upon the wafer surface, to be presented at the desired angle with respect to a line between the wafer and the hearth. This rotation of each wafer and the curved or convolutional path that it follows in its up and down sweeping is illustrated schematically in FIG. 15.

Figure 15:
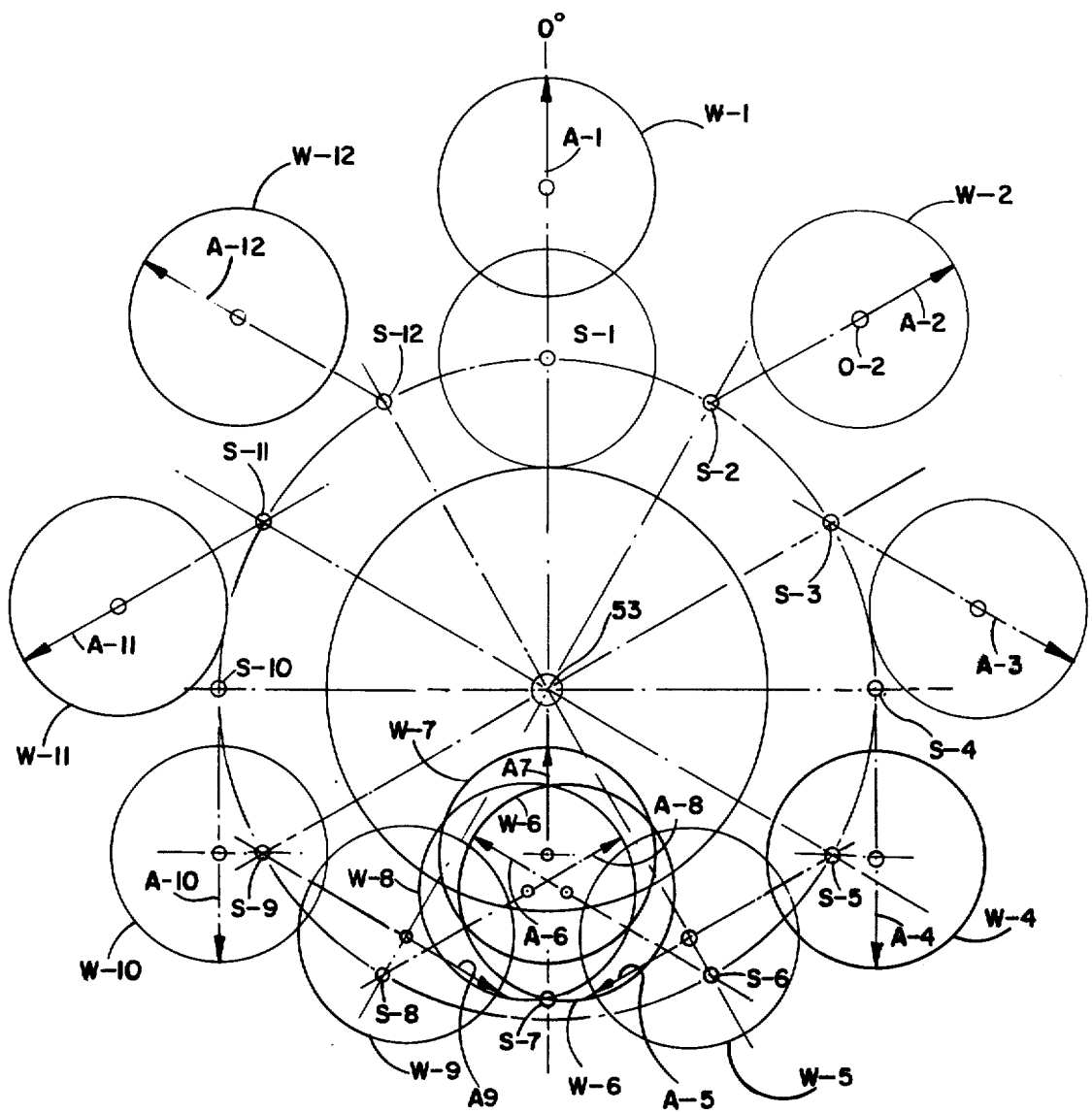
FIG. 15 is a line drawing illustrating certain components of the motion of a single wafer relative to a cluster standard, FIG. 16 schematically depicts various positions of a wafer, illustrating the maintenance of the selected acute angle within the relatively narrow range of variation.

For clarity of illustration of motions of a wafer about the primary axis and the secondary axis, components of motion about the base axis 22 are omitted from the illustration of FIG. 15. In other words, FIG. 15 schematically depicts motion of a wafer relative to the moving cluster standard upon which its primary spider is carried. A single wafer is illustrated in FIG. 15 as a circle and the various positions thereof are designated by the respective reference characters W-1, W-2 through and including W-12. This illustration depicts twelve positions of a single wafer at twelve equally spaced angular positions of rotation of the primary spider about the primary axis 53. Positions of the wafer secondary axis 103 at these equally spaced positions of rotation about primary axis 53 are designated respectively as S-1 through S-12, inclusive. As the single illustrated wafer of the schematic showing of FIG. 15 moves through one complete up and down sweep, its own axis (center) moves through positions indicated as O-1, O-2 through O-12, respectively, and the wafer itself is oriented in the direction indicated by the several arrows A-1, A-2 through A-12, respectively. Thus, it will be seen that when the cluster rotates in a clockwise direction, for example, through an angle of 30°, the secondary axis moves from a position S-1 to S-2 and the center or axis of the wafer accordingly moves from a position indicated at O-1 to that indicated at O-2. This motion of the wafer and its axis with respect to the secondary axis is due to the fact that the wafer is carried by the secondary four-armed spider which is moving about the secondary axis, even while the secondary axis itself is moving about the primary axis.

In the arrangement illustrated in FIG. 15, the relative rotational speeds about the secondary axis and the primary axis is two-to-one, that is, the secondary spider is rotating about the secondary axis at double the rate of rotation of the primary spider about the primary axis. It is important that the rotational speed of the secondary spider about axis 103 be greater than the speed of the primary spider about axis 53. These relative rotational speeds are, of course, controlled by the relative dimensions of the drive gears and circumferential lengths of the drive chains. Ratios of rotational speeds about the secondary and primary axis are preferably at least 2:1 and not greater than 10:1. If the rotational speed ratio is greater than 10:1, movement of the wafer is too fast. At ratios of rotational speeds of less than 2:1, the path of a given wafer has less than adequate convolution and area of the cloud swept by a given wafer is undesirably decreased.

In a third position of angular movement of the primary spider, the secondary axis is positioned as indicated at S-3 which in this example is 60° from the position S-1. However, the wafer has rotated not 60° but 120° about its secondary axis (with the illustrated 2:1 speed ratio) and accordingly, the wafer at this third position is oriented as indicated by the arrow A-3. Successive positions and orientations of the wafer at successive angular positions of the primary spider, each displaced by 30° from the proceeding primary spider position, are illustrated in FIG. 15. Thus, it will be seen that the wafer, at its position indicated at W-7 has effectively rotated 360° about its own axis, as indicated by arrow A-7, whereas the primary spider has rotated but 180°. When the primary spider has rotated through a full 360°, the wafer has changed its orientation by twice that amount, having moved through two full rotations in the illustrated arrangement. The large area covered by the wafer in its convolutional sweep is particularly illustrated by inspection of the positions of the wafer as indicated as W-5, W-6, W-7, W-8 and W-9. It will then be understood, of course, as previously indicated, that FIG. 15 depicts only two of the rotational motions of the wafer and the several paths of motion illustrated in FIG. 15 are, in actuality, of even greater complexity since the entire primary spider is itself moving in a circumferential path about the cloud during the course of the illustrated motions of FIG. 15.

It is found that maximum efficiency, uniformity and density of coating of critical areas of irregularities such as grooves, channels or troughs formed in the surface of the wafer are achieved most efficiently and most uniformly when the angle (referred to herein as a presentation angle) between a line on the surface of the wafer and a line extending from the wafer surface to the source 16 is at or about 41°. Accordingly, the illustrated arrangement of wafer transport mechanisms does provide for the various rotational motions of each wafer through the previously described convolutional paths and, at the same time, always maintains this presentation angle at or close to its optimum value. The maintenance of orientation to continuously provide this optimum angle of presentation is achieved by appropriate positioning and dimensioning of the cluster standard and primary and secondary axes with respect to the base axis and the hearth, and the specific choice of acute angles of the primary and secondary axes. Thus, the primary axis 53 is downwardly inclined with respect to a horizontal plane normal to the base axis 22 by a small angle, in the order of 5° in the illustrated example. This is accomplished by virtue of the 5° bend previously described in the upper portion 42 relative to lower portion 40 of the standard 34b. Further, each secondary axis 103 extends at an acute angle with respect to its associated primary axis, such angle being 11° in the illustrated example, by virtue of the inward angulation of the several outwardly extending arms of the primary spider, With these angular orientations of primary and secondary axes, each wafer of each group of wafers of each cluster of groups of wafers will always maintain a presentation angle that does not vary by more than about 10° from the optimum 41° angle of presentation. This is achieved even while all wafers are moved about the three axes of rotation and through the intricate and complex convolutional paths described above. It is important to maintain the presentation angle in the range of 25° to 55°, and preferably in the range of 33° to 49°.

Figure 17:
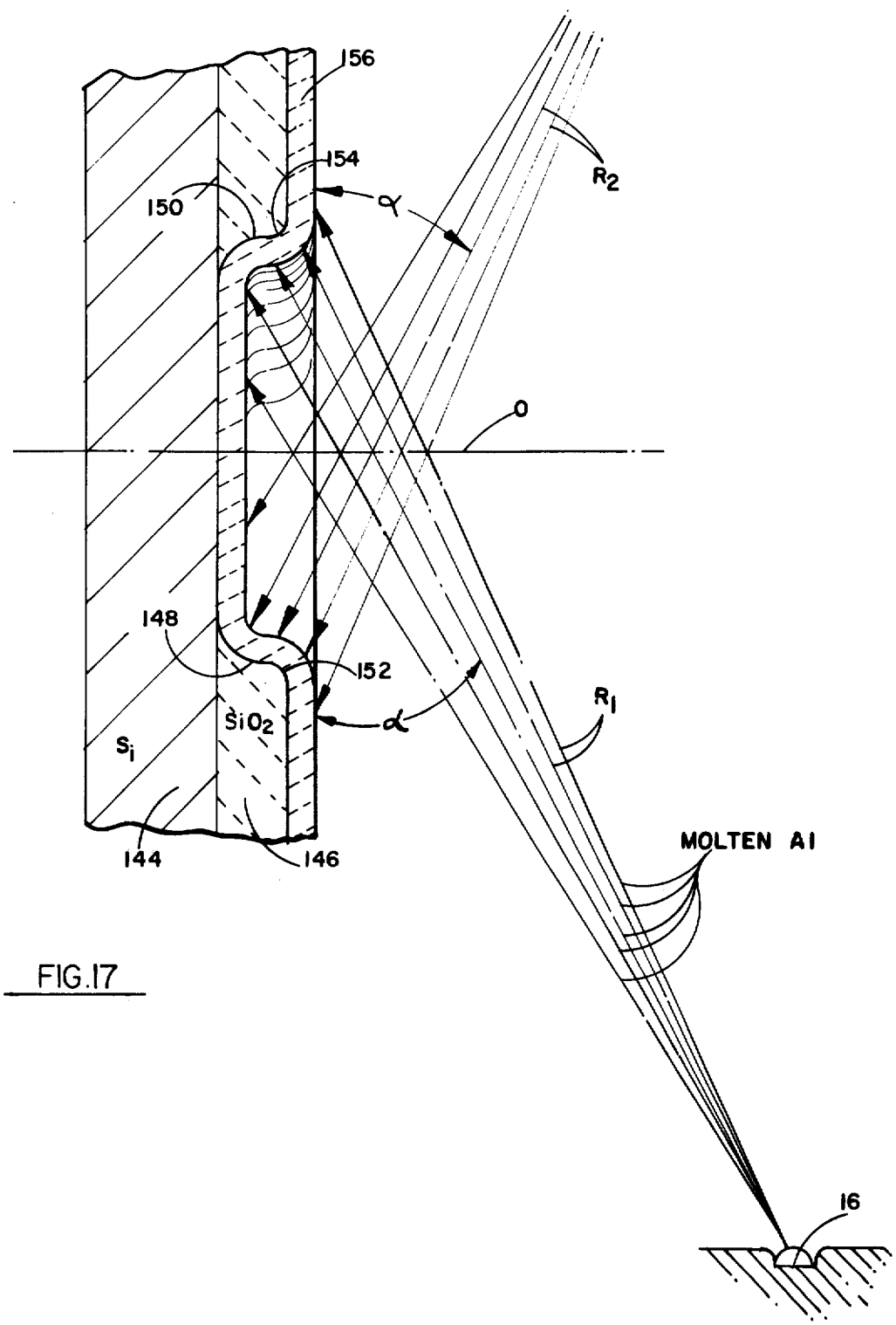
FIG. 17 is an enlarged fragmentary view of a wafer surface channel illustrating the selected angular orientation of the wafer surface.

Significance of the presentation angles may be understood by inspection of FIG. 17. Illustrated in this figure is a fragmentary sectional view, greatly enlarged, of a wafer and the metallic coating applied to its surface. A typical MOS wafer may have a first layer 144 of silicon, for example, and a second layer 146 of silicon dioxide. In the course of processing of the wafer, a groove or channel is formed in the wafer surface by removing portions of the silicon dioxide layer. Such groove or channel, which is merely exemplary of different types of surface irregularities, has relatively steep sides 148, 150 which may be nearly perpendicular to the surface of the wafer. There are also channel edges of brinks 152, 154. The brinks 152, 154 of the groove or channels are the areas most difficult to coat and a larger percentage of coating deficiencies occur at these areas. The metallic coating, often of aluminum, as indicated at 156, is deposited over the entire surface of the multilayer wafer, over the surface of the silicon dioxide and continuing down along the sides of the groove and over the bottom of the groove. As illustrated in FIG. 17, aluminum particles emanating from the source 16 may move toward the surface of the wafer along the indicated rays R1. Accordingly, it will be seen that the presentation angle alpha between the rays and the surface of the wafer is an acute angle. As indicated above, this angle is preferably about 41°. In the relative orientation of wafer and hearth illustrated in FIG. 17, the side 150 and brink 154 of the groove is presented at the proper angle. It is important, of course, that the opposite side of the groove also be presented at the proper angle and accordingly, relative rotation of the wafer, effectively about its own axis indicated at O in FIG. 17, will present the wafer to the hearth so that the optimum presentation angle is provided between the surface of the wafer and rays R-2 from the hearth toward the opposite brink 152.

Figure 16:
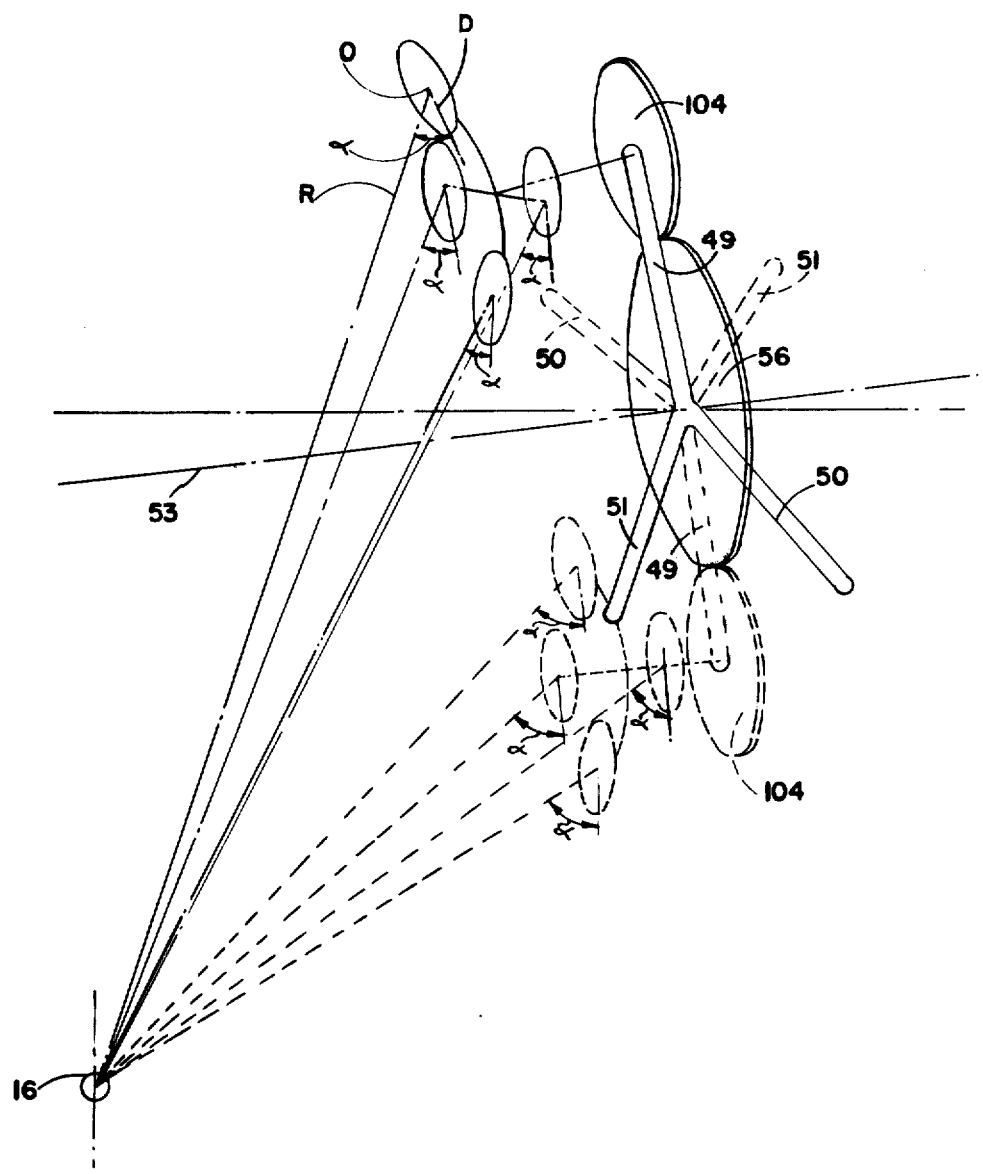

FIG. 16 is a schematic illustration of the presentation angle alpha of the wafers of a single group of wafers. The single group of wafers of FIG. 16 is shown in two different positions. A first position is near the top of an up and down sweep and a second position, shown in dotted lines, is near the bottom of such up and down sweep. Each presentation angle alpha in FIG. 16 is illustrated as lying in a plane containing a line designated R, for example, from the source 16 to central point O of the wafer. The angle is formed between the line R and a line D on the surface of the wafer lying in a vertical plane containing the line R. FIG. 16 is not a geometrically precise illustration of this angle, being merely a perspective view to indicate heuristically the fact that the angle alpha from the hearth to any point on the wafer at any position (actually at the eight different positions illustrated in FIG. 16) will remain substantially at the optimum 41° value, varying only slightly from this value during all motions. It is emphasized that this maintenance of a narrow range of angles with a range substantially centered upon the optimum presentation angle, during the course of the multirotational convolutional motions of all of the wafers, ensures optimum coating density and thickness of the steps and walls of surface irregularities and channels. This optimum coating thickness and density is significantly enhanced by the convolutional motions of the wafers through the clouds.

It will be seen that there has been disclosed methods and apparatus for coating substrates which provide for improved convolutional paths of motion through and about a cloud of material to be deposited upon the substrate and, in addition, maintain an optimum angle of presentation, within narrow limits, of the substrate surface with respect to the source of material to be coated. These results are achieved by means of a simplified, reliable, readily repairable and easily loaded and unloaded apparatus.

The foregoing detailed description is to be clearly understood as given by way of illustration and example only, the spirit and scope of this invention being limited solely by the appended claims.

I claim:

1. Apparatus for holding workpieces comprising
a base support,
an annular base mounted to said base support for rotation about a base axis,
means for driving said annular base about said axis, a plurality of cluster standards fixed to and upstanding from said annular base at points spaced about the periphery thereof, and
a plurality of cluster assemblies each respectively mounted on a respective one of said cluster standards, each said cluster assembly comprising
a primary multi-armed spider mounted on an associated cluster standard for rotation about a primary axis, a plurality of secondary multi-armed spiders each respectively mounted on a respective one of the arms of said primary spiders for rotation about respective ones of a plurality of secondary axes, holding means carried on each arm of said secondary spiders for
holding a workpiece, means for rotating said primary spiders relative to the associated cluster standard, and means for rotating each of said secondary spiders relative to the arm on which it is rotatably mounted.

2. The apparatus of claim 1 including a sealed housing mounted on a housing support, and a source of vapor carried within said housing.

3. The apparatus of claim 1, wherein said primary axis is angularly displaced from a normal to said base axis by a small angle.

4. The apparatus of claim 3, wherein said small angle is about 5°.

5. The apparatus of claim 1, wherein each said secondary axis is inclined toward said primary axis by a small angle.

6. The apparatus of claim 5 wherein said small angle is about eleven degrees.

7. The apparatus of claim 1, wherein said primary axis is angulated with respect to said base axis and wherein each of said secondary axes extends at an acute angle with respect to said primary axis.

8. The apparatus of claim 1, wherein said primary multi-armed spider includes a plurality of arms each extending nearly radially outwardly at an angle of less than 90° from said primary axis.

9. The apparatus of claim 1, wherein said means for driving said base comprises a base drive chain fixed to said base, a base drive sprocket wheel meshing with said chain, and a driven shaft fixed to said wheel.

10. The apparatus of claim 1, wherein said means for rotating said primary spider comprises a primary drive chain fixed to said base support, and a primary drive sprocket wheel fixed to said primary spider and journalled in said cluster standard in meshing engagement with said primary drive chain.

11. The apparatus of claim 10, wherein said means for rotating said secondary spiders about the respective secondary axes of the arms of said primary spider comprise a driving disc fixed to said primary drive sprocket wheel, a secondary drive chain fixed to said driving disc, and a plurality of secondary drive sprocket wheels respectively journalled upon respective arms of said primary spider in meshing engagement with respective ones of said secondary spiders.

12. The apparatus of claim 1, wherein said cluster assembly is detachably connected as a unit to its respective cluster standard.

13. The apparatus of claim 1, wherein each cluster standard includes at an upper end thereof a pair of mutually spaced upwardly projecting arms defining a slot therebetween, and wherein each said cluster assembly includes a T-section connector fixed to and projecting from the assembly, said T-section connector having a central leg adapted to be slidingly and detachably engaged in said slot of said cluster standard.

14. The apparatus of claim 1, wherein each of said holding means comprises a holding plate having first and second clips mutually spaced about and projecting from the periphery thereof, and a locking clip, said locking clip comprising a lever pivoted to said plate, spring means for biasing said lever to locking position, and a handle on said lever extending outwardly of said plate for pivoting said lever against the urging of said spring means.

15. The apparatus recited in claim 1 wherein
said means for rotating said primary spiders causes said primary spiders to rotate at a first speed, and
said means for rotating each of said secondary spiders interacts with said means for rotating said primary spiders whereby said means for rotating each of said secondary spiders causes said secondary spiders to rotate at a second speed,
whereby a workpiece held by said holding means is concurrently rotated in different paths at different speeds.

16. The apparatus of claim 15, wherein the angular velocity of said secondary spiders is at least twice as great as said angular velocity of said primary spider.

17. The apparatus recited in claim 1 including,
means for creating a vapor cloud in the proximity of the apparatus such that workpieces are moved through said vapor cloud to be coated thereby.

18. The apparatus recited in claim 17 wherein
the angle between a surface of each workpiece and a line projected from said means for creating a vapor cloud is maintained within the range of 25° to 55° throughout the rotation of said workpieces.

19. The appratus recited in claim 1 wherein said base axis and said primary axis are substantially perpendicular to each other.

20. In combination, a base support means having a base axis, means for rotationally driving said base support means about said base axis, a plurality of cluster standards fixed to and upstanding from said base support means whereby said cluster standards rotate about said base axis with said base support means, a plurality of cluster assemblies each respectively mounted on a respective one of said cluster standards, each said cluster assembly comprising a primary support means mounted on an associated cluster standard and having a primary axis, primary drive means interacting between said base support means and said primary support means to rotationally drive said primary support means about said primary axis when said base support means is driven about said base axis, a plurality of secondary support means each respectively mounted on one of said primary support means for rotation about respective ones of a plurality of secondary axes, secondary drive means interacting between said primary support means and said secondary support means to rotationally drive said secondary support means about said secondary axes when said primary support means is driven about said primary axis, holding means carried on said secondary support means for retaining a workpiece, means for rotating said primary support means relative to the associated cluster standard, and means for rotating each of said secondary support means relative to the primary support means on which it is rotably mounted.

* * * * *